United States Patent [19]
Miller

[11] Patent Number: 4,859,570
[45] Date of Patent: Aug. 22, 1989

[54] PHOTOSENSITIVE ELEMENT HAVING IMPROVED ANTISTATIC LAYER

[75] Inventor: Conrad E. Miller, Hendersonville, N.C.

[73] Assignee: E. I. Du Pont de Nemours and Company, Wilmington, Del.

[21] Appl. No.: 275,956

[22] Filed: Nov. 25, 1988

Related U.S. Application Data

[63] Continuation of Ser. No. 75,454, Jul. 20, 1987, abandoned.

[51] Int. Cl.[4] .............................................. B03C 1/82
[52] U.S. Cl. .................................. 430/271; 430/273; 430/527; 430/529; 430/531; 430/533
[58] Field of Search ............... 430/271, 273, 527, 529, 430/531, 533

[56] References Cited

PUBLICATIONS

Sushkov et al, Vysokomolekulyarnye Soedineniya (A), 26, pp. 2291–2298 (1984) No. 1, USSR.

*Primary Examiner*—Jack P. Brammer

[57] ABSTRACT

An element, e.g., photogrpahic element, comprising a polymeric shaped article having available carboxyl groups on the surface thereof and which is coated with at least one permanent antistatic layer consisting essentially of the reaction product of (1) water-soluble, electrically conductive polymer having functionally attached carboxyl groups integral to the polymer, and
(2) polyfunctional substituted aziridine, e.g., with alkyl of 1 to 6 carbon atoms, the coating weight of the antistatic layer, based on weight of (1), being less than 4.5 mg/dm$^2$, preferablyless than 3.8 mg/dm.

Elements using such layers are free of haze and show reduced propensity to produce static. The layers are useful in silver halide, photopolymer, diazo, and vesicular image-forming elements, etc.

21 Claims, 1 Drawing Sheet

F I G. 1
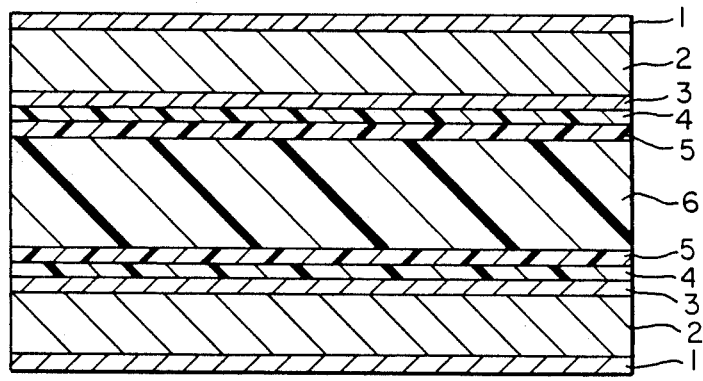
F I G. 2
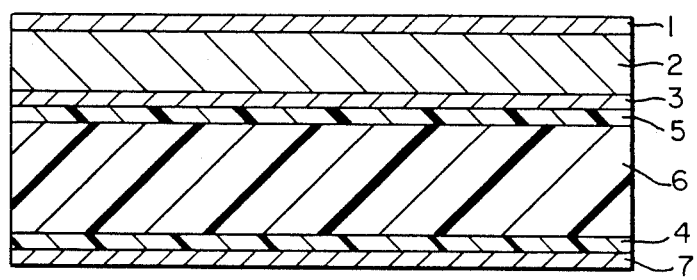

PHOTOSENSITIVE ELEMENT HAVING IMPROVED ANTISTATIC LAYER

This application is a continuation of application Ser. No. 07/075,454 filed July 20, 1987, now abandoned.

TECHNICAL FIELD

This invention relates to an element having improved antistatic properties. More particularly, this invention relates to a photographic element having an antistatic layer coated at a low coating weight and which demonstrate improved physical properties in association with photographic layers.

BACKGROUND ART

Since most film supports used in the practice of preparing photosensitive elements are comprised of polymeric shaped supports and these have a high dielectrical constant, they exhibit a propensity to produce static during use. Static will yield unwanted exposure of the photosensitive layers associated with such supports and cannot be tolerated. It is well-known to prepare antistatic compositions containing antistatic agents and other components and to coat these compositions in layers on the film supports during the preparation of the photographic element. One such antistatic composition is described by Schadt, III, U.S. Pat. No. 4,225,665. A description of the associated state of the art related to this field is contained in this reference.

Although the Schadt, III composition and associated layers made therefrom is adequate in preventing static within the photographic element, Schadt, III suffers from some disadvantages which prevent full utilization of his system. One disadvantage is that the Schadt, III layers must be coated to a rather thick coating weight which adds to the coating cost and increases inherent light scattering or haze in the element thereby reducing the clarity and usefulness of photographic elements made therefrom. Haze is particularly onerous when associated with elements wherein the antistatic layer is not overcoated with a silver halide emulsion or gel layer. Another disadvantage of Schadt, III is that a multicomponent system is used, including a binding agent and a crosslinking agent in addition to the antistatic agent, whereby premature crosslinking can occur prior to coating.

In assignee's copending Miller application U.S. Ser. No. 875,251, filed June 17, 1986 now U.S. Pat. No. 4,701,403, based on U.S. Ser. No. 691,768, filed Jan. 16, 1985, now abandoned, there is described an improvement over Schadt, III in which the components are segregated and the crosslinking agent coated as a separate layer. Miller found that when a composition containing antistatic agent and crosslinking agent with and without a binding agent are coated as a single layer the physical and electrical permanence is reduced. The process described by Miller allows the coating of overall thinner antistatic layers, prevents premature crosslinking of associated polymeric materials and provides physical and electrical permanence. However, the Miller process requires a two step coating which required additional investment and operating cost.

It is desired to provide in a photographic element a relatively thin layer which will yield more permanent antistatic properties, improved optical properties, and maintain the clarity of the final element made therefrom.

SUMMARY OF THE INVENTION

In accordance with this invention there is provided an element comprising a polymeric shaped article having available carboxyl groups on the surface thereof and which is coated with at least one permanent antistatic layer consisting essentially of the reaction product of
(1) a water-soluble, electrically conductive polymer having functionally attached carboxyl groups integral to the polymer, and,
(2) a polyfunctional substituted aziridine wherein at least one hydrogen atom on a carbon atom of the aziridine ring is substituted with an alkyl substituent wherein alkyl is of 1 to 6 carbon atoms, the antistatic layer having a coating weight based on the weight of conductive polymer (1) of less than 4.5 mg/cm$^2$.

In accordance with another embodiment of this invention there is provided a photographic element comprising a polymeric film support having available carboxyl groups on the surface thereof, a photosensitive layer on the support, and a permanent antistatic layer coated on at least one surface of the support, the antistatic layer consisting essentially of the reaction product of (1) a water-soluble, electrically conductive polymer having functionally attached carboxyl groups integral to the polymer, and (2) a polyfunctional substituted aziridine wherein at least one hydrogen atom on a carbon atom of the aziridine ring is substituted with an alkyl substituent wherein alkyl is of 1 to 6 carbon atoms, wherein the aziridine interlinks (1) and the carboxyl groups on the surface of the support to form an antistatic layer having a coating weight based on the weight of conductive polymer (1) of less than 4.5 mg/dm.

BRIEF DESCRIPTION OF THE DRAWINGS

In the accompanying Figures forming a material part of this disclosure wherein the figures are a schematic view in cross section of a photographic element.

FIG. 1 illustrates a photographic element having a photographic emulsion coated on both sides of a support and which employs at least two antistatic layers according to this invention.

FIG. 2 illustrates a single-side photographic emulsion coated photographic element which employs only a single antistatic layer according to this invention on the backside of the support.

DISCLOSURE OF THE INVENTION

In the practice of this invention, preferably an aqueous solution of the water-soluble, conductive polymer (1) and the polyfunctional substituted aziridine as described above is prepared, and a small amount of a wetting or coating agent is added thereto to obtain good dispersion of the ingredients. Subsequently the aqueous solution is coated onto a support, e.g., fiber, paper, plastic film, etc., as the desired antistatic layer. As the support, or polymeric shaped article, a preferred material is polyethylene terephthalate, herein referred to as (polyester base). The invention is not limited to use of polyester base as other supports can be used that have available carboxyl groups on their surface. For example, a paper support would contain a plastic overcoat, e.g., polyethylene which could be flame treated or reacted to form carboxyl groups on its surface. In fact, this invention could be useful in providing an antistatic layer for any of said supports with carboxyl, hydroxyl, amino, or thiol surface groups. The base, which preferably is a film, may be suitably subbed, e.g., resin subbed, to receive the antistatic layer of this invention on which other layers such as gel subs or the photographic emulsion layer may then be coated. Surprisingly it has been found that the gel sub can be replaced by the antistatic layer of the invention. The resin sub is not necessary if the base, for example, is flame treated. Particularly preferred as electrically conductive polymer (1) is a copolymer of the sodium salt of styrene sulfonic acid with maleic acid in a 3:1 ratio while component (2) is a polyfunctional aziridine having an alkyl or dialkyl substituent capable of forming a dual-dimensional structure which interlinks the support and (1), above.

Referring now specifically to the drawings wherein the numbers where applicable are identical in each figure, FIG. 1 shows a typical double-side coated photographic element in which layers (1) are abrasion layers; layers (2) are gelatino, silver halide emulsion layers, for example; layers (3) are gel sub layers; layers 94) are antistatic layers according to this invention; layers (5) are resin subbing layers; and (6) is the polyester base support. A typical application for the illustrated element is in the field of medical X-ray, for example.

FIG. 2 shows a typical single-side coated photographic element which can be used in the field of graphic arts, for example. In FIG. 2 the various layers from top to bottom are: (1) an abrasion layer; (2) the gelatino, silver halide emulsion layer; (3) a gel sub; (5) a resin sub; (6) a polyester base support; (4) an antistatic layer according to this invention; and (7) an antihalation layer described in Cho U.S. Pat. No. 4,585,730, e.g., Example 1 of this patent.

It is preferable to apply, and dry-cure, the antistatic layer during the manufacture of the polyester support as taught by Alles in U.S. Pat. No. 2,779,684, and to apply a resin subbing layer such as the mixed-polymer subbing compositions of vinylidene chloride-itaconic acid, taught by Rawlins in U.S. Pat. No. 3,567,452, prior to the application of the antistatic layer. When polyethylene terephthalate is manufactured for use as a photographic support, the polymer is cast as a film, the mixed polymer subbing composition of Rawlins is applied to one or both sides and the structure is then biaxially stretched, followed by application (coating) of a gelatin subbing layer. Upon completion of stretching and the application of subbing compositions, it is necessary to remove strain and tension in the support by a heat treatment comparable to the annealing of glass. Air temperatures of from 100° C. to 160° C. are typically used for this heat treatment, which is referred to as the poststretch heat relax. If desired, one or both of the gelatin subbing layers can be replaced by the formulation of the present invention and thus, the facilities and heat treatment involved in support manufacturing, when used for the application and drying-curing of the present invention, serve a dual purpose and result in an increase in productivity and economy.

In a preferred embodiment the electrically conductive, antistatic polymer (1) comprises a copolymer of the sodium salt of styrene sulfonic acid and maleic acid in a 3:1 molar ratio having a number average molecular weight of about 20,000 which can be determined by gel permeation chromatography (GPC). This molecular weight is desirable to insure water solubility and to obtain transparent and haze-free coatings. If the ratio of styrene sulfonic acid to maleic acid is greater than 3:1, higher molecular weight copolymers are possible, e.g., at a ratio of 9:1, a useful number average molecular weight is about 70,000 (GPC). The higher amount of the electrically conductive sodium salt of styrene sulfonic acid in relation to the carboxylate unit serves to balance the requirement for antistatic protection with sufficient capability of the copolymer to become permanently attached to the support, via these carboxylic groups.

The preferred polyfunctional substituted aziridine (2) crosslinking agent is pentaerythritol-tri-[β-(N-alkyl or dialkyl-substituted aziridinyl)propionate] represented by the formula:

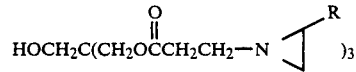

where R is alkyl or dialkyl wherein alkyl is of 1 to 6, preferably 1 to 4, carbon atoms e.g., methyl, ethyl, propyl, butyl, amyl or hexyl or isomers thereof. Aziridine compounds represented by the above formula are preferred. Aziridine compounds, wherein the R substituent is aryl, e.g., of 6 to 10 carbon atoms such as phenyl or naphthyl, or wherein at least one hydrogen atom on the second carbon atom of the aziridine ring may also be substituted with alkyl or aryl substituents as described above, have not been tested but may be useful provided that an effective amount can be incorporated into the coating solution to provide physical and electrical permanence. The particularly preferred methyl substituted polyfunctional aziridine of this type is a soluble clear, amber liquid having an aziridine content of 5.5 milliequivalents per gram and an aziridine functionality of 2.6. Other polyfunctional aziridine hardeners can also be used such as trimethylol propane tri[β-(N-alkyl or dialkyl-aziridinyl)propionate]:

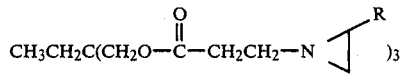

wherein R is as defined above, and trimethylol propane-tri-[β-(N-(methylaziridinyl)) propionate] of the formula:

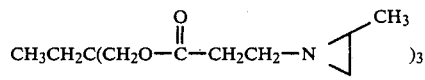

which is preferred for this type polyfunctional aziridine.

Other polyfunctional substituted aziridines can be employed as long as at least two crosslinking groups are contained in each molecule. While not being limited to any theory, it is believed that the alkyl substituent of the polyfunctional substituted aziridine (2) present with the electrically conductive polymer (1) inhibits premature crosslinking reaction thereby providing a practical "pot" life and yet provides good crosslinking of the coated layer.

Surfactants or wetting agents may be incorporated to assist in the dispersion of (1) and (2) above in water, and in fact, such addition is preferred. Preferred are anionic surfactants such as Fluorad® FC 127, a solution of 50% potassium N-ethyl-[(perfluorooctyl) sulfonyl] glycinate, 4% ethanol and 32% water, manufactured by 3M Co.; Triton® X-200, a 28% solution of a sodium alkylaryl polyether sulfonate, manufactured by Rohm & Haas Co.; Standapol® ES40, a 58% solution of a disodium alkyl sulfosuccinate, American Cyanamid Co., and amphoteric surfactants such as Product BCO ®, alpha-trimethylamino stearic acid, E. I. Du Pont de Nemours Co., or Deriphat ® 151, sodium N-coca beta-aminopropionate, Henkel, Inc., U.S.A. Other useful surfactants are included in the classes of sodium lauryl sulfonate, dioctyl sodium sulfosuccinate, sodium octyl phenyl polyether sulfonate, and other sodium alkyl aryl polyether sulfonates, etc.

In the preparation of the coating solution used to make the antistatic layers of this invention, a mixture ratio of 100:10 for (1):(2) is preferred, although ranges of 100:4 to 100:30, all on a weight ratio basis will also function within the ambit of this invention. The antistatic layers are preferably applied as an intermediate layer between the polyester base support (which can be suitably subbed or energy treated to be receptive to the coating, e.g., electric discharge treated,) and the photosensitive layers coated contiguous thereto. However, the antistatic layers of this invention will also function if they are used as a backing layer, for example (See FIG. 2). Dry coating weights of less than 4.5 mg/cm$^2$ (based on weight of component (1) of the mixture) are preferred with particularly preferred dry coating weights being less than 3.8 mg/dm$^2$.

The antistatic layer of the present invention may also contain addenda which do not degrade the antistatic properties. Typical are matting agents, plasticizers, lubricants, surfactants, dyes, and haze reducing agents. The antistatic polymer with carboxyl groups, and the stabilizing surfactant, if needed, are all of the same charge type, i.e., anionic, or the surfactants may be nonionic or amphoteric, so as to allow crosslinking without the incompatibility which could occur if cationic and anionic elements were mixed together.

The photosensitive and/or radiation sensitive layers useful with the present invention may be any which are well-known for imaging and reproduction in fields such as graphic arts, printing, medical and information systems. Elements made according to this invention are free of physical defects such as unwanted haze and also show a reduced propensity to produce static. Costs of preparing structures as described can be reduced using a thin, single antistatic layer which effectively retains its physical and electrical permanence. Photopolymer, diazo, vesicular image-forming compositions and other systems may be used in addition to silver halide. Photographic silver halide emulsion employing any of the commonly known halides, e.g., bromide, chloride, iodide or mixtures of two or more, may be used. These may be of varied content and be negative and/or positive working. The response of the silver halide may be enhanced and stabilized by such chemical agents as boranes, amines, polyethylene oxides, tetraazaindenes, benzotriazole, alkali halides, phenyl mercaptotetrazole, and gold, mercury and sulfur compounds. In addition dyes, development modifiers, covering power polymers, surfactants, latices, hardeners and other addenda known in the photographic art may be employed with the photographic silver halide emulsion. A preferred embodiment of the invention is described in Example 1.

The emulsions of this invention can be used in any of the conventional photographic systems, e.g., negative or positive-working systems. Thus, they can contain any of the adjuvants related to the particular system employed. For example, the emulsions when employed as direct positive may be chemically fogged using metals such as rhodium or iridium, etc. or with other chemical fogging agents such as boranes, as well-known to those skilled in the art.

EXAMPLES

In all the examples which illustrate but do not limit the invention, and wherein the parts and percentages are by weight, the antistatic coatings are applied to a 0.004 inch (0.10 mm) polyethylene terephthalate film base, suitably subbed with a conventional resin sub. The layers are applied using a conventional coater at the conditions shown. Coating weights are achieved by varying the air knife pressure and this is shown below. Other tests common to these examples are as follows:

Coating Weights:

Coating weights of ingredient (1) were measured by x-ray fluorescence of sulfur using a Phillips PW1400 x-ray spectrometer.

Haze:

Measured with a Gardner Hazemeter, model UX10, with illumination "C".

Surface Resistivity:

Measured at 50% RH, 72° F. (21° C.) with a Keithley model 6105 resistivity adaptor, a model 240A power supply and a model 610 electrometer. Applied voltage=500 v.

Discharge ½ Time:

Measured at 20% RH with a Monroe model 276A static discharge analyzer. Applied voltage=1600 v. (initial).

EXAMPLE 1

The following solution, representing the invention, was prepared by thoroughly mixing the following ingredients:

| Ingredient | Function | Amt. (lbs.) |
| --- | --- | --- |
| 25% aqueous soln. of a 3/1 copolymer of Na-styrene sulfonate/maleic anhydride | Antistat (1) | 250.00 |
| pentaerythritol-tri-[-β-(N—2-methylaziridinyl)-propionate] | Crosslinker (2) | 6.25 |
| 10% aqueous soln. of alpha-trimethylamino stearic acid | Dispersing Agent | 18.00 |
| 7.5% aqueous H$_2$SO$_4$ | pH Adjust | 25.00 |
| Deionized Water | — | 1489.00 |

This mixture (Sample 1) represents ratio of 100:10 for (1):(2), parts/part by weight. For comparison purposes, a mixture representing the prior art (Sample 2) was made from the following ingredients:

| Ingredient | Function | Amt. (g) |
| --- | --- | --- |
| Copolymer from above | Antistat (1) | 294.0 |
| Aziridinyl compound from above | Crosslinker (2) | 12.3 |
| 41.5% Aqueous Dispersion of a 45/35/4/8 copolymer of styrene/butylmethacrylate/butylacrylate/methacrylic acid | Binder (3) | 118.1 |
| Dispersion Agent from above | Dispersing Agent | 35.0 |
| 7.5% aqueous H$_2$SO$_4$ | pH Adjust | 49.0 |
| Deionized water | — | 2992.0 |

Sample 2 gave a ratio of 100:10 based on weight of carboxyl-containing polymers (1) and 93) to crosslinking agent (2). Samples from both solutions were then coated on a 0.004 inch (0.10 mm) polyethylene terephthalate film support having a conventional resin sub on both sides. Each sample was then heat relaxed to achieve dimensional stability. Each sample was tested for haze, propensity to generate static and physical and electrical permanence with the following results shown in Table 1 below:

TABLE 1

| Sample | Ctg. Wt. [mg. of (1)/dm$^2$] | Air-knife Press (in. of H$_2$O) | Coat. Speed (fpm) | % Haze | Resist (ohms/sq.) Before test | Resist (ohms/sq.) After test | Disch. ½ Time (sec.) |
|---|---|---|---|---|---|---|---|
| 1 | 3.64 | 20 | 347 | 0.31 | $5.24 \times 10^9$ | $5.72 \times 10^9$ | 0.62 |
| 2 (Control) | 3.40 | 6 | 250 | 2.65 | $2.56 \times 10^9$ | $3.10 \times 10^9$ | 1.04 |

This example demonstrates the utility of this invention. The sample representing the invention had almost no haze compared to the sample representing the prior art. Although the surface resistivities are of the same order, Sample 1 of this invention had a significantly faster discharge rate which is more indicative of good antistatic properties. When each sample was rubber 10 times in a circular pattern with a water saturated tissue and then blotted dry with another tissue no physical damage was shown and the surface resistivity remained substantially unchanged as noted above in Table 1.

EXAMPLE 2

An antihalation backing layer identical to that described in Example 1 of Cho U.S. Pat. No. 4,585,730 was prepared. Polystyrene sodium sulfonate (a conductive polymer) was added to this backing layer in an amount sufficient enough to be 1% by weight of the mixture. Two 0.004 inch (0.10 mm) polyester film support samples were prepared. Sample 1 (Control) was coated with a conventional resin sub and gel substratum on both sides. Sample 2 of the invention contained the conventional resin sub and antistatic layer of this invention as prepared in Example 1 above, on one side and the conventional resin sub/gel substratum on the other side. The aforementioned antihalation backing layer was applied on the antistat coated side of Sample 2 and a resin sub/gel substratum coated side of Sample 1. The elements were then dried. On the opposite side of both elements silver halide emulsion layers (see Example 4 of the Cho U.S. Pat. No. 4,585,730) were applied along with a conventional gel overcoat. After drying, the samples were tested for propensity to static by measuring the surface resistivity (see the aforementioned Cho patent) with the following results as shown in Table 2 below.

TABLE 2

| Sample | Resistivity (Ohms/Sq) |
|---|---|
| 1 (Control) | $>1 \times 10^{18}$ |
| 2 | $3.5 \times 10^{11}$ |

The lower the number the better the static protection achieved.

EXAMPLE 3

The following solution, representing the invention, is prepared and coated with 6 inches H$_2$O air knife pressure at 250 fpm, dried and heat relaxed as described in Example 1:

| Ingredient | Function | Amt. (q) |
|---|---|---|
| 25% Aqueous soln. of a 3/1 copolymer of Na-styrene sulfonate/maleic anhydride | Antistat (1) | 490.0 |
| Pentaerythritol-tri-[beta-(N—2-ethylaziridyl) propionate] | Crosslinker (2) | 12.3 |
| Fluorad ® FC 127 | Dispersing Agent | 1.0 |
| 7.5% Aqueous H$_2$SO$_4$ | pH Adjust | 25.0 |
| Deionized water | — | 2972.0 |

Haze surface resistivity, electrical permanence and discharge rate are good.

EXAMPLE 4

A coating of the following solution is prepared and coated as described in Example 3:

| Ingredient | Function | Amt. (q) |
|---|---|---|
| 25% Aqueous soln. of a 3/1 copolymr of Na-styrene sulfonate/maleic anhydride | Antistat (1) | 490.0 |
| Pentaerythritol-tri-[beta-(N—2,2-dimethylaziridyl) propionate] | Crosslinker (2) | 12.3 |
| Fluorad ® FC 127 | Dispersing Agent | 1.0 |
| 7.5% Aqueous H$_2$SO$_4$ | pH Adjust | 25.0 |
| Deionized water | | 2972.0 |

Haze, surface resistivity, electrical permanence, and discharge rate are good.

I claim:

1. A photographic element comprising a polymeric film support having carboxyl groups attached to the surface thereof, a photosensitive layer on the support, and a permanent antistatic layer coated on at least one surface of the support, the antistatic layer consisting essentially of the reaction product of (1) a water-soluble, electrically conductive polymer having functionally attached carboxyl groups integral to the polymer, and (2) a polyfunctional substituted aziridine wherein at least one hydrogen atom on a carbon atom of the aziridine ring is substituted with an alkyl substituent wherein alkyl is of 1 to 6 carbon atoms, wherein the aziridine interlinks the water-soluble, electrically conductive polymer having functionally attached carboxyl groups integral to the polymer and the carboxyl groups on the surface of the support to form an antistatic layer having a coating weight based on the weight of conductive polymer (1) of less than 4.5 mg/dm$^2$.

2. A photographic element according to claim 1 wherein on a weight basis, the proportions of (1) to (2) range from 100:4 to 100:30.

3. A photographic element according to claim 1 wherein on a weight basis, the proportion of (1) to (2) is 100 to 10.

4. A photographic element according to claim 1 wherein the photosensitive layer is a photographic silver halide emulsion layer.

5. A photographic element according to claim 1 wherein the photosensitive layer is a layer of a photopolymer composition.

6. A photographic element according to claim 1 wherein the support is a polyester film.

7. A photographic element according to claim 6 wherein the polyester support is polyethylene terephthalate.

8. A photographic element according to claim 6 wherein the polyester support is resin coated.

9. A photographic element according to claim 6 wherein the polyester support is energy treated.

10. A photographic element according to claim 1 wherein copolymer (1) is a copolymer of the sodium salt of styrene sulfonic acid and the disodium salt of maleic acid.

11. A photographic element according to claim 1 wherein the coating weight based on the weight of conductive polymer of the antistatic layer is less than 3.8 mg/dm$^2$.

12. A photographic element according to claim 1 wherein a hydrogen atom on an aziridinyl carbon atom of the polyfunctional aziridine is substituted with a methyl group.

13. A photographic element according to claim 1 wherein a hydrogen atom on an aziridinyl carbon atom of the polyfunctional aziridine is substituted with an ethyl group.

14. A photographic element according to claim 1 wherein a hydrogen atom on both aziridinyl carbon atoms of the polyfunctional aziridine is substituted with a methyl group.

15. A photographic element according to claim 1 wherein the permanent antistatic layer is coated on the same side of the support and under the photosensitive layer.

16. A photographic element according to claim 1 wherein the permanent antistatic layer is coated on the side of the support opposite the photosensitive layer.

17. A photographic element according to claim 1 wherein the photosensitive layer and antistatic layer are coated on both sides of the support.

18. A photographic element comprising a polyethylene terephthalate support having carboxyl groups attached to the surface thereof and having coated on one side a photosensitive silver halide or photopolymerizable layer, and coated on the support beneath the photosensitive layer a permanent antistatic layer consisting essentially of the reaction product of (1) a copolymer of the sodium salt of styrene sulfonic acid and the disodium salt of maleic acid in a 3:1 mole ratio, and (2) a polyfunctional substituted aziridine wherein one hydrogen atom on a carbon atom of the aziridine ring is substituted with an alkyl substituent wherein alkyl is of 1 to 4 carbon atoms, wherein the aziridine interlinks the copolymer of the sodium salt of styrene sulfonic acid and the disodium salt of maleic acid in a 3:1 mole ratio and the carboxyl groups on the surface of the support to form an antistatic layer having a coating weight based on the weight of copolymer (1) of less than 3.8 mg/dm$^2$ and wherein aziridine (2) may range from 4 to 30 parts per 100 parts of copolymer (1), on a weight ratio basis.

19. A photographic element according to claim 1 wherein the permanent antistatic layer is solely coated on the side of the support opposite to that bearing the photosensitive layer.

20. A photographic element according to claim 18 wherein a second permanent antistatic layer is coated on the side of the support opposite to that bearing the photosensitive layer.

21. A photographic element according to claim 18 wherein a surfactant or wetting agent is present in the coating of the antistatic layer.

* * * * *